United States Patent
Wu

(10) Patent No.: US 6,602,737 B2
(45) Date of Patent: Aug. 5, 2003

(54) SEMICONDUCTOR PACKAGE WITH HEAT-DISSIPATING STRUCTURE AND METHOD OF MAKING THE SAME

(75) Inventor: Chi Chuan Wu, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/948,527

(22) Filed: Sep. 8, 2001

(65) Prior Publication Data

US 2002/0155640 A1 Oct. 24, 2002

(51) Int. Cl.⁷ .................................................. H01L 21/50
(52) U.S. Cl. ...................... 438/122; 438/124; 438/127
(58) Field of Search .................................. 438/127, 124, 438/106, 107, 105, 584, 122

(56) References Cited

U.S. PATENT DOCUMENTS

| | | | | |
|---|---|---|---|---|
| 5,533,256 A | * | 7/1996 | Call et al. .................. | 174/16.3 |
| 5,642,261 A | * | 6/1997 | Bond et al. ................ | 257/707 |
| 5,981,310 A | * | 11/1999 | DiGiacomo et al. ........ | 438/106 |
| 6,054,337 A | * | 4/2000 | Solberg ...................... | 438/106 |
| 6,291,264 B1 | * | 9/2001 | Tang et al. ................. | 438/106 |
| 6,337,445 B1 | * | 1/2002 | Abbott et al. .............. | 174/257 |
| 2002/0079593 A1 | * | 6/2001 | Huang ......................... | 257/778 |
| 2002/0006718 A1 | * | 9/2001 | Distefano ................... | 438/617 |

* cited by examiner

Primary Examiner—Michael Trinh
(74) Attorney, Agent, or Firm—Peter F. Corless; Steven M. Jensen; Edwards & Angell, LLP

(57) ABSTRACT

A semiconductor package with a heat-dissipating structure and a method for making the same are proposed. The heat-dissipating structure includes a heat sink and a plurality of solder columns, wherein the solder columns are attached at ends thereof to the heat sink and to a substrate, so as to support the heat sink to be positioned above a semiconductor chip mounted on the substrate. A reflow process performed after the attachment of the heat-dissipating structure to the substrate allows the self-alignment of the solder columns with respect to predetermined positions on the substrate, which helps precisely control the positioning of the heat-dissipating structure fixed on the substrate. Moreover, the solder columns can protect the substrate from being damaged or deformed during a molding process. In addition, the heat-dissipating structure is simple in structure, which simplifies the manufacturing process and reduces the cost.

9 Claims, 4 Drawing Sheets

SEMICONDUCTOR PACKAGE WITH HEAT-DISSIPATING STRUCTURE AND METHOD OF MAKING THE SAME

FIELD OF THE INVENTION

The present invention relates to semiconductor packages and more particularly, to a semiconductor package with a heat-dissipating structure for enhancing heat-dissipating efficiency and the method for making the semiconductor package.

BACKGROUND OF THE INVENTION

A conventional BGA (Ball Grid Array) semiconductor package with a heat-dissipating device is illustrated in FIG. 5, as designated by the reference numeral 1. In the drawing, this semiconductor package 1 includes a substrate 10 having a first side 10A and a second side 10B, with a semiconductor chip 12 mounted on the first side 10A and electrically connected to the substrate 10 via gold wires 11. Further, a heat sink 13 is attached to the first side 10A of the substrate 10 by means of an adhesive 16. The heat sink 13 is composed of a flat section 130 and supporting sections 131 used to support the flat section 130 to be positioned above the chip 12 at a predetermined height. A receiving space 132 defined by the flat section 130, the supporting sections 131 and the first side 10A of the substrate 10 is used to receive the chip 12 and the gold wires 11 therein. Moreover, an encapsulant 14 is formed through a molding process to hermetically enclose the chip 12, the gold wires 11, the heat sink 13 and the first side 10A of the substrate 10, with an upper side 130A of the flat section 130 of the heat sink 13 exposed to the atmosphere. Finally, a plurality of solder balls 15 are mounted on the second side 10B of the substrate 10.

One drawback to the foregoing BGA semiconductor package 1, however, is that the heat sink 13 may be attached to the substrate 10 in a slant manner, due to failure in accurately controlling the amount of the adhesive 16 applied to the supporting sections 131, as shown in FIG. 5. As a result, a portion 130C of the flat section 130 slants downwardly and a spacing is then formed between an encapsulating mold (not shown) for forming the encapsulant 14 and the portion 130C during the molding process, allowing flash of a molding resin used for making the encapsulant 14 to form on the portion 130C; when the upper side 130A of the flat section 130 of the heat sink 13 for heat-dissipation is partly covered by the flash of the molding resin, the area of the upper side 130A directly exposed to the atmosphere is decreased and the heat-dissipating efficiency thereof is reduced. Accordingly, another portion 130D of the flat section 130 is upwardly slanted in response to the downward slant of the portion 130C, which leads to damage to the substrate 10 resulting from the clamping force generated by the encapsulating mold for forming the encapsulant 14. Therefore, quality and appearance of the semiconductor package 1 are degraded.

Another drawback to the aforementioned semiconductor package 1 is that, the heat sink 13 can not be positioned precisely on the substrate 10 by using the adhesive 16 for attachment thereof. If the heat sink 13 is not disposed in a predetermined position, the package appearance may be damaged, and short circuit may occur, due to accidental contact of the supporting section 131 with the gold wires 11 used for electrically connecting the chip 12 to the substrate 10.

In conclusion, it is disadvantageous to manufacture a semiconductor package with planarity and positioning of a heat sink mounted therein unable to be assured, and it is also cost-ineffective and a waste of resources to discard those unqualified products. In addition, a complex process, e.g. stamping, is required for the manufacture of the heat sink with the desired flat section and supporting sections, and thus the manufacturing cost is increased.

SUMMARY OF THE INVENTION

It is therefore an objective of the present invention to provide a semiconductor package with a heat-dissipating structure and the method for making the same, which assure the planarity and positioning of the heat-dissipating structure on a substrate on which the heat-dissipating structure is mounted so as to enhance the quality and yield of the manufactured package and to lower the manufacturing cost.

It is another objective of the invention to provide a semiconductor package with a heat-dissipating structure and the method for making the same, which simplify the manufacturing process and reduce the manufacturing cost thereof, due to the attachment of the heat dissipating structure to the substrate being free of the use of any adhesive.

It is still another objective of the invention to provide a semiconductor package with a heat-dissipating structure and the method for making the same, which help prevent flash from contaminating the surface of the heat-dissipating structure exposed to the atmosphere.

It is yet another objective of the invention to provide a semiconductor package with a heat-dissipating structure and the method for making the same, which help increase the heat-dissipating efficiency by forming a protrusion on the heat-dissipating structure toward the semiconductor chip.

In accordance with the foregoing and other objectives of the invention, a semiconductor package with a heat-dissipating structure and the method for making the same are proposed. The semiconductor package of the invention includes a substrate having a first side and a second side; a semiconductor chip attached to and electrically connected to the first side of the substrate; a heat-dissipating structure comprising a heat sink having a first surface and a second surface and a plurality of solder columns attached to the second surface of the heat sink, so that the heat sink is elevated to a predetermined height above the semiconductor chip via the solder columns when the heat-dissipating structure is mounted on the first side of the substrate via the solder columns; an encapsulant formed on the first side of the substrate so as to encapsulate the semiconductor chip and the heat-dissipating structure in a manner that the first surface of the heat sink is exposed to the exterior of the encapsulant; and a plurality of conductive elements attached to the second side of the substrate.

The method for making the semiconductor package of the invention comprises the steps of: providing a heat sink having a first surface and a second surface; forming a plurality of concaves at preset positions on the second surface of the heat sink, the concaves being arranged in position not to interfere with electrical connection between a semiconductor chip and a substrate for carrying the semiconductor chip and the heat sink; attaching a plurality of solder columns to the concaves on the second surface of the heat sink respectively to form a heat-dissipating structure; providing a substrate having a first side and a second side; forming on the first side of the substrate a plurality of connecting pads for attaching the solder columns; mounting at least one semiconductor chip on the first side of the substrate and electrically connecting the semiconductor chip to the substrate; attaching the heat-dissipating structure to the first side of the substrate by reflowing the solder columns to the connecting pads on the substrate; forming an encapsulant on the first side of the substrate to encapsulate the semiconductor chip and the heat-dissipating structure, while allowing the first side of the heat sink to be exposed to the atmosphere; and mounting a plurality of conductive elements on the second side of the substrate.

Alternatively, the manufacture of the semiconductor package of the invention may further comprise a step of encapsulating the semiconductor chip mounted on the substrate, prior to the step of attaching the heat-dissipating structure to the substrate by reflowing the solder columns to the connecting pads of the substrate.

The concaves on the second surface of the heat sink may be formed by etching solder mask coated on the heat sink.

The solder columns are made of material having a melting point lower than that of the heat sink, such that the solder columns are flexible in nature and capable of acting as a cushion between the heat sink and the substrate to thereby prevent the substrate from being damaged during a molding process for forming the encapsulant. The material suitable for the solder columns may be the one selected from the consisting of tin, lead, and tin/lead alloy.

Further, the heat sink can be further formed with a protrusion from the second surface thereof toward the semiconductor chip mounted on the substrate. By this arrangement, the heat-dissipation efficiency of the semiconductor package of this invention can be further enhanced due to the decreased distance between the heat sink and the semiconductor chip.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF THE PREFERRED EMBODIMENT

First Preferred Embodiment

Figure 1A:
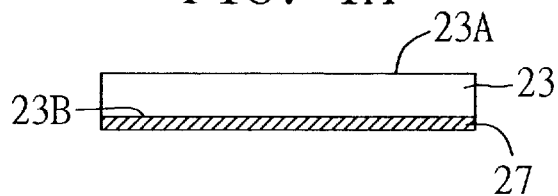
FIGS. 1A–1J are schematic sectional diagrams showing the steps for the manufacture of the semiconductor package in accordance with a first preferred embodiment of the invention.
Figure 1B:
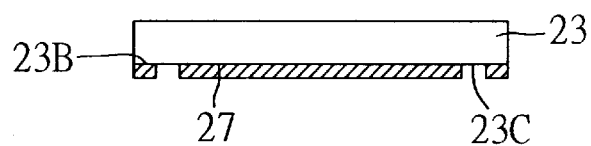
Figure 1C:
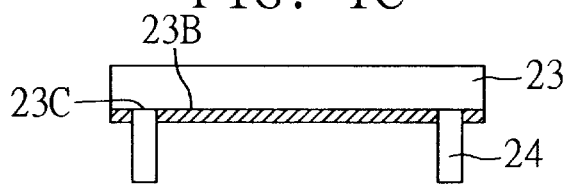
Figure 1D:
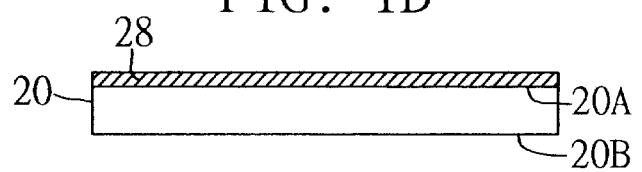
Figure 1E:
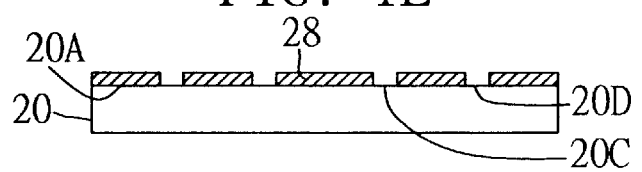
Figure 1F:
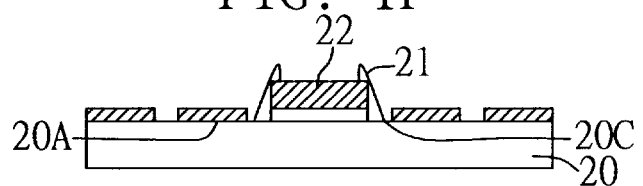
Figure 1G:
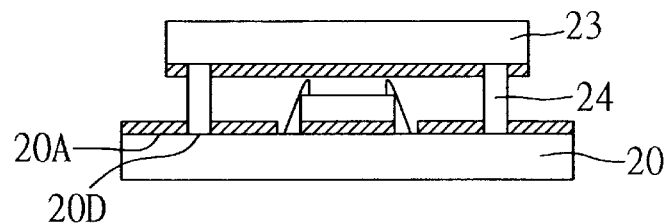
Figure 1H:
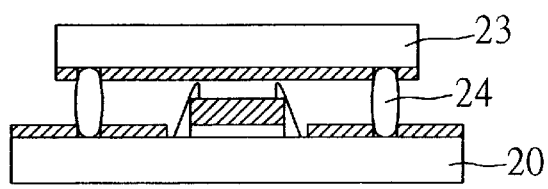
Figure 1I:
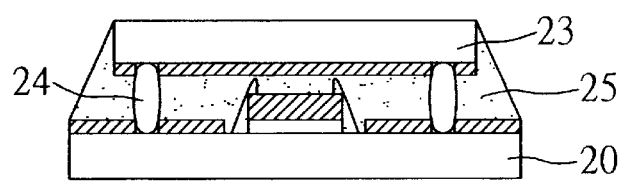

The semiconductor package of the first preferred embodiment of the invention is manufactured through the steps depicted in the following with reference to FIGS. 1A–1J; FIG. 2 illustrates a top view of the semiconductor package of the invention.

Figure 1J:
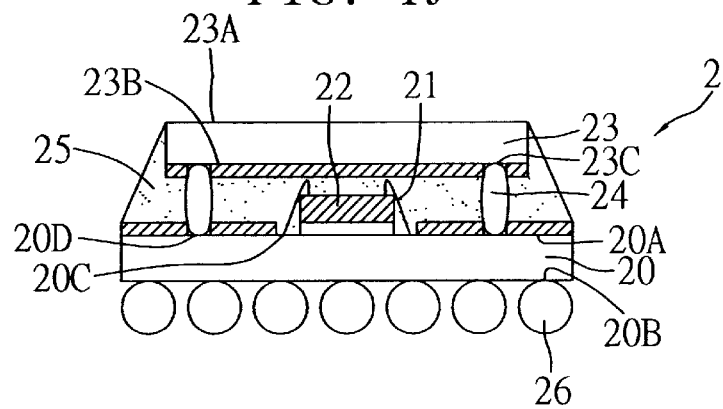
Figure 2:
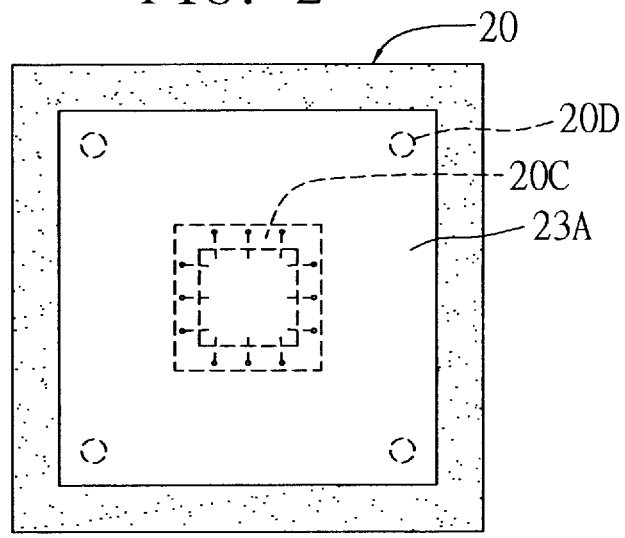
FIG. 2 is a top view of the semiconductor package of the first preferred embodiment of the invention.

Referring to FIGS. 1J and 2, the semiconductor package 2 of the first preferred embodiment of the invention includes a substrate 20 having a first side 20A and a second side 20B; at least one semiconductor chip 22 mounted on the first side 20A of the substrate 20; a plurality of bonding wires 21 electrically connecting the semiconductor chip 22 and the substrate 20; a heat-dissipating structure including a heat sink 23 and a plurality of solder columns 24, the heat sink 23 having a first surface 23A and a second surface 23B, with the solder columns 24 attached to the second surface 23B thereof to support the heat sink 23 to be positioned above the semiconductor chip 22 mounted on the first side 20A of the substrate 20; an encapsulant 25 formed on the first side 20A of the substrate 20 for encapsulating the semiconductor chip 22, the bonding wires 21, the solder columns 24, and the heat sink 23, while allowing the first surface 23A of the heat sink 23 to be exposed to the atmosphere; and a plurality of solder balls 26 mounted on the second side 20B of the substrate 20.

The manufacture of the aforementioned semiconductor package 2 of the invention comprises the following steps. First, referring to FIG. 1A, a heat sink 23 having a first surface 23A and a second surface 23B is provided. The heat sink 23 is coated with solder mask 27 at least on the second surface 23B thereof. Then as shown in FIG. 1B, a plurality of concaves 23C are formed at preset positions on the second surface 23B of the heat sink 23 by etching the solder mask 27.

Referring to FIG. 1C, a plurality of solder columns 24 are attached by conventional ball-implantation methods to the concaves 23C on the second surface 23B of the heat sink 23 to form with the heat sink 23 into the heat-dissipating structure. The solder columns 24 are made of material having a melting point lower than that of the heat sink 23, and selected from a group consisting of tin, lead and tin/lead alloy.

Referring to FIG. 1D, a substrate 20 having a first side 20A and a second side 20B is provided. On the first side 20A of the substrate there is formed a solder mask 28. As the application of a solder mask to a substrate is conventional to persons skilled in the art, description thereto will not be detailed herein. Then as shown in FIG. 1E, a plurality of openings 20C for exposing bond pads (not shown) on the substrate 20 for attaching bonding wires and a plurality of connecting pads 20D (four are shown in FIG. 2) for attaching the solder columns 24 are formed on the first side 20A of the substrate 20, wherein the openings 20C and connecting pads 20D are formed etching the solder mask layer 28 on the first side 20A of the substrate 20.

Referring to FIG. 1F, at least one semiconductor chip 22 is mounted on the first side 20A of the substrate 20, and a plurality of bonding wires 21, such as gold wires, are connected from the semiconductor chip 22 to the openings 20C on the first side 20A of the substrate 20, allowing the semiconductor chip 22 to be electrically connected to the substrate 20.

Referring to FIG. 1G, the solder columns 24 are attached to the connecting pads 20D on the first side 20A of the substrate 20 by applying flux (not shown) to ends of the solder columns 24 or by applying solder paste (not shown) to the connecting pads 20D. Then, a reflow process is performed to collapse the solder columns 24 to become an ellipsoid-like shape and to be aligned with the connecting pads 20D, allowing the heat sink 23 to be precisely positioned above the semiconductor chip 22 mounted on the first side 20A of the substrate 20 via the solder columns 24. In addition, since the collapsing extent of the solder columns 24 can be accurately controlled, the positioning, height and planarity of the heat sink 23 above the substrate 20, as shown in FIG. 1H, can thus meet desired requirements.

Accordingly, flash on the first surface 23A of the heat sink 23 as well as damage to the substrate 20 during a subsequent molding process can be prevented.

Referring to FIG. 1I, an encapsulant 25 is formed on the first side 20A of the substrate 20 by using a conventional encapsulating resin, such as epoxy resin via transfer molding to encapsulate the semiconductor chip 22, the bonding wires 21, the solder columns 24, and the heat sink 23, allowing the first surface 23A of the heat sink 23 to be exposed to the atmosphere.

Finally, as shown in FIG. 1J, a plurality of solder balls 26 are mounted on the second side 20B of the substrate 20 by conventional ball-implantation methods, and therefore the manufacture of the semiconductor package 2 is completed.

In conclusion, in order to eliminate the difficulty in accurately controlling the planarity and positioning of a heat sink by using an adhesive for attaching the heat sink to a substrate in a conventional BGA semiconductor package, the present invention proposes a novel semiconductor package with a heat-dissipating structure that uses solder columns for positioning a heat sink on a substrate. Positions on the heat sink for attaching the solder columns to the connecting pads on the substrate are precisely defined by etching a solder mask layer formed on the heat sink and the substrate. Further, alter attaching the solder columns to the substrate, a reflow process is performed to allow the self-alignment of the solder columns with respect to the connecting pads, to help accurately control the positioning and planarity of the heat sink above the substrate. Furthennore, after molding, a first surface of the heat sink is completely exposed to the atmosphere, allowing the heat-dissipating efficiency to be enhanced. In addition, since the heat-dissipating structure including the heat sink and the solder columns is simple to manufacture, the manufacturing process is simplified and the cost is reduced.

Second Preferred Embodiment

Figure 3A:
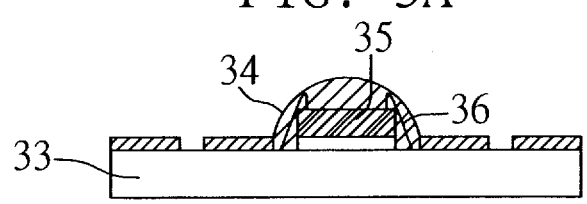
FIG. 3A is a schematic sectional diagram showing the step of partially encapsulating the semiconductor chip of the semiconductor package in accordance with a second preferred embodiment of the invention.
Figure 3B:
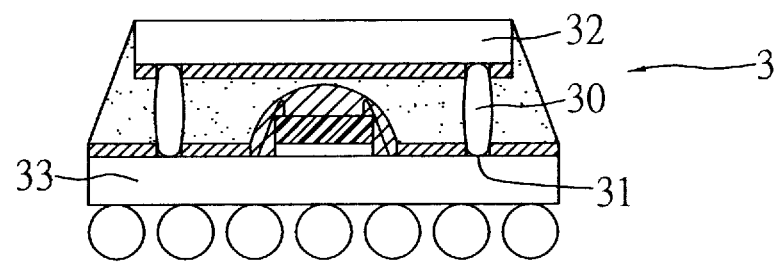
FIG. 3B is a schematic sectional diagram of the semiconductor package in accordance with a second preferred embodiment of the invention.

FIGS. 3A and 3B illustrate the semiconductor package of the second preferred embodiment of the invention.

Referring to FIG. 3B, the semiconductor package 3 of the second preferred embodiment of the invention is similarly manufactured by the method disclosed in the first preferred embodiment, with the difference that prior to the step of attaching solder columns 30 to the connecting pads 31 on a substrate 33 for connecting a heat sink 32 to the substrate 33, an resin body 34 is formed to encapsulate a semiconductor chip 35 and a plurality of bonding wires 36 for electrically connecting the semiconductor chip 35 to the substrate 33, as shown in FIG. 3A. This helps prevent contamination to the semiconductor chip 35 and the bonding wires 36 during the reflow process of attaching the solder columns 30 to the substrate 33.

Third Preferred Embodiment

Figure 4:
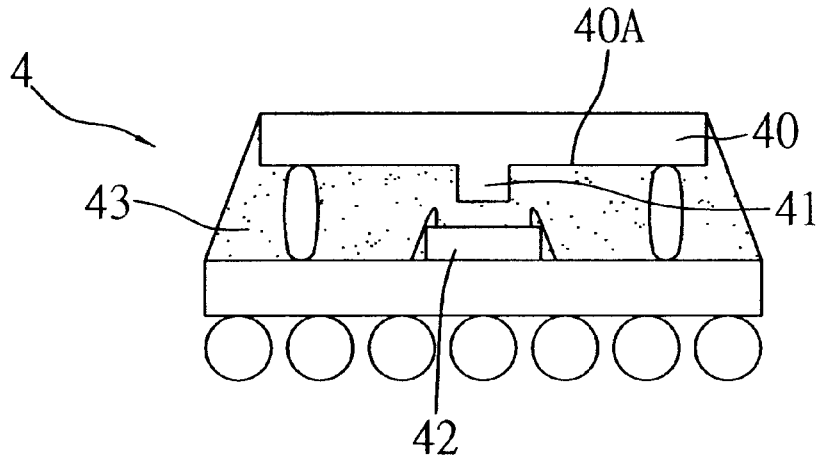
FIG. 4 is a schematic sectional diagram of the semiconductor package in accordance with a third preferred embodiment of the invention.
Figure 5:
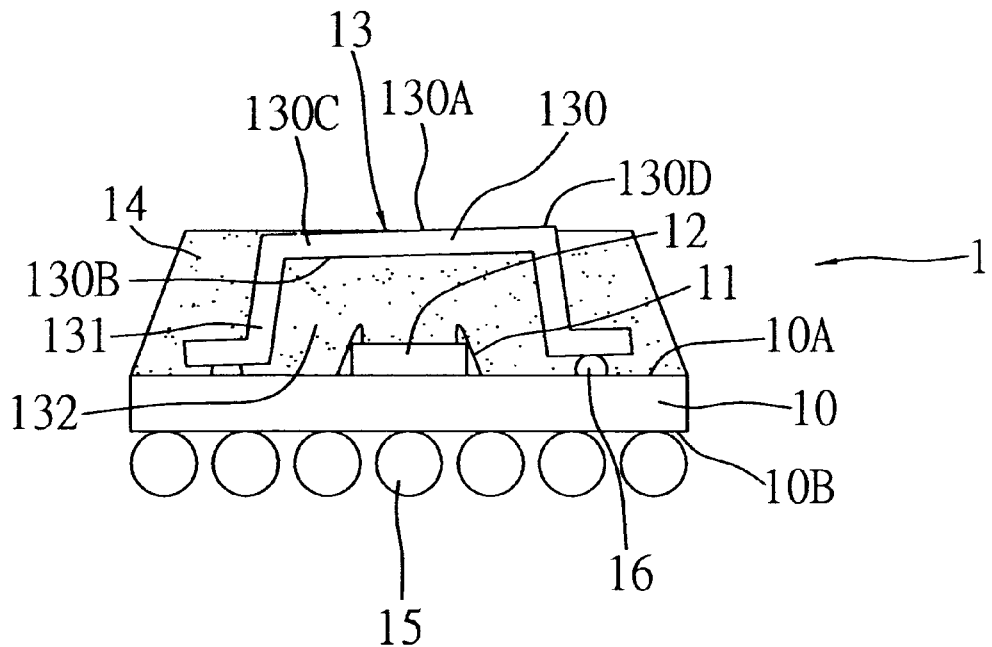
FIG. 5 (PRIOR ART) is a schematic sectional diagram of a conventional semiconductor package with a heat sink.

FIG. 4 illustrates the semiconductor package of the third preferred embodiment of the invention.

Referring to FIG. 4, the semiconductor package 4 of the third preferred embodiment of the invention is similarly manufactured by the method disclosed in the first preferred embodiment, with the difference that there is at least one protrusion 41 (one is shown in the drawing) formed on a second surface 40A of a heat sink 40. By the provision of the protrusion 41, the distance between the heat sink 40 and a semiconductor chip 42 positioned below the heat sink 40 is reduced. As a result, the heat-dissipating efficiency can be improved due to the shortened distance between the heat sink 40 and the semiconductor chip 42.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for making a semiconductor package, comprising the steps of:

providing a heat-dissipating structure comprising a heat sink having a first surface and a second surface, and a plurality of solder columns attached to the second surface of the heat sink;

providing a substrate having a first side and a second side;

forming a plurality of connecting pads on the first side of the substrate for attaching the solder columns to the substrate;

mounting at least one semiconductor chip on the first side of the substrate, and electrically connecting the semiconductor chip to the substrate;

attaching the solder columns to the connecting pads on the first side of the substrate for mounting the heat-dissipating structure on the substrate in a manner that the heat sink is positioned above the semiconductor chip;

forming an encapsulant on the first side of the substrate to encapsulate the semiconductor chip and the heat-dissipating structure, while allowing the first surface of the heat sink to be exposed to the atmosphere; and mounting a plurality of conductive elements on the second side of the substrate.

2. The method of claim 1, wherein on the second surface of the heat sink a plurality of concaves are formed by etching a solder mask layer formed on the second surface of the heat sink, so as for the solder columns to be attached thereto.

3. The method of claim 1, wherein the connecting pads are formed by etching a solder mask layer preformed on the first side of the substrate.

4. The method of claim 1, wherein the solder columns are made of material having a melting point lower than that of the heat sink.

5. The method of claim 4, wherein the material is selected from a group consisting of tin, lead and tin/lead alloy.

6. The method of claim 1, wherein the solder columns are attached to the connecting pads by applying solder paste to the connecting pads.

7. The method of claim 1, wherein the solder columns are attached to the connecting pads by applying flux to ends of the solder columns.

8. The method of claim 1, further comprising a step of forming a resin body for encapsulating the semiconductor chip prior to the step of attaching the solder columns to the connecting pads.

9. The method of claim 1, wherein the heat sink is further formed with at least one protrusion on the second surface thereof.

* * * * *

UNITED STATES PATENT AND TRADEMARK OFFICE
CERTIFICATE OF CORRECTION

PATENT NO.   : 6,602,737 B2
DATED        : August 5, 2003
INVENTOR(S)  : Wu

It is certified that error appears in the above-identified patent and that said Letters Patent is hereby corrected as shown below:

Title page,
Item [65], after "US 2002/0155640 A1 Oct. 24, 2002" please add:
-- [30]   Foreign Application Priority Data
Apr. 18, 2001 (TW) ……………. 90109239 --.

Signed and Sealed this

Sixth Day of April, 2004

JON W. DUDAS
*Acting Director of the United States Patent and Trademark Office*